United States Patent [19]
Manfredi et al.

[11] Patent Number: 5,894,622
[45] Date of Patent: Apr. 20, 1999

[54] BRUSH CONDITIONER WING

[75] Inventors: Paul A. Manfredi, Waterbury; Douglas P. Nadeau, Underhill; Raymond G. Morris, Essex Junction, all of Vt.; Richard A. Bartley, Newburgh, N.Y.; Michael R. Amsden, deceased, late of Londonderry, Vt., by Sharon M. Crossman Executrix

[73] Assignee: International Business Machines Corporation, Armonk, N.Y.

[21] Appl. No.: 09/001,733

[22] Filed: Dec. 31, 1997

[51] Int. Cl.[6] .................................................. B08B 11/02

[52] U.S. Cl. ................... 15/102; 15/97.1; 15/77; 15/256.5; 15/93.1

[58] Field of Search .......................... 15/77, 88.2, 102, 15/256.5, 93.1, 21.1; 134/6

[56] References Cited

U.S. PATENT DOCUMENTS

| 5,144,711 | 9/1992 | Grill, Jr. ................................ | 15/97.1 |
| 5,311,634 | 5/1994 | Andros .................................. | 15/97.1 |
| 5,442,422 | 8/1995 | Owens, Jr. et al. .................. | 15/265.5 |

*Primary Examiner*—Gary K. Graham
*Attorney, Agent, or Firm*—Howard J. Walter, Jr.

[57] ABSTRACT

A brush conditioner for a semiconductor wafer cleaning tool including a pair if opposed, rotating flexible brushes. The conditioner is a wing-like structure having a leading edge and a trailing edge. The leading edge is forced against the rotating brushes flexing them to assist in removal of foreign material. The trailing edge tapers to a point and provides stability to the wing.

7 Claims, 2 Drawing Sheets

BRUSH CONDITIONER WING

FIELD OF THE INVENTION

This invention relates to semiconductor manufacturing equipment and more particularly to equipment used in the Chemical-Mechanical-Polishing (CMP) of semiconductor wafers and the cleaning of wafers following the basic polishing processes. More specifically this invention relates to conditioners for rotary brush cleaning equipment.

BACKGROUND OF THE INVENTION

In the polishing and cleaning of semiconductor wafers, there is known a certain type of brush cleaning tool which uses a pair of rotating sponge brushes as described in Gill, Jr.'s U.S. Pat. No. 5,144,711. Such a cleaning tool is offered commercially by Westech Systems as their model 3800 Automated Wafer Cleaner. Andros, U.S. Pat. No. 5,311,634 also teaches a form of rotary brush cleaner.

It is well known in the CMP technology to provide for the cleaning of semiconductor wafers following a CMP process, see for example Blackwell, U.S. Pat. No. 5,320,706 for a general teaching of the use of a cleaning process.

It is also well know to provide for the conditioning of a polishing pad in situ during the actual polishing process as evidenced by reference to Bombardier et al. U.S. Pat. No. 5,154,021 which teaches the conditioning of a polishing pad by the application of compressed air to the pad prior to its contact with the work piece and Prigge et al. U.S. Pat. No. 5,167,667 which teaches the application of a liquid for treating a polishing cloth following the completion of a polishing process.

The IBM Technical Disclosure Bulletin, "Water/Air Brush for Wafer Chem-Mech Polishing," Vol. 37, No. Mar. 03, 1994, p. 345, shows an in situ polishing and conditioner tool in which an air brush and hot water dispenser are placed on the polishing pad while the wafer/work piece is being polished.

In the processing of semiconductor wafers using a rotating brush tool of the Gill/Westech type following the CMP planarization of polysilicon filled trenches, residual particles were found to cause rejects of product due to the presence of foreign material (FM).

Accordingly, it is an object of this invention to reduce the FM present after polishing semiconductor wafers while cleaning them with a rotary brush cleaner.

It is another object to increase the throughput of wafers cleaned after being polished by speeding up the cleaning process.

SUMMARY OF THE INVENTION

These and other objects of the invention are achieved by the use of a rigid wing or conditioner which is placed between the rotating brushes or cleaning disks such that as the brushes rotate, the wing causes the surface of the brush to deflect around the wing in a manner such that FM on the surface or embedded in the brushes is forcibly removed. In addition means are provided to optionally provide a continuous flow of water or other cleaning fluid over the surface of the brushes to further facilitate their cleaning.

These and other aspects of the invention will become evident upon review of the more detailed description of the invention and its operation in connection with the accompanying drawings.

DESCRIPTION OF THE PREFERRED EMBODIMENT

Figure 1:
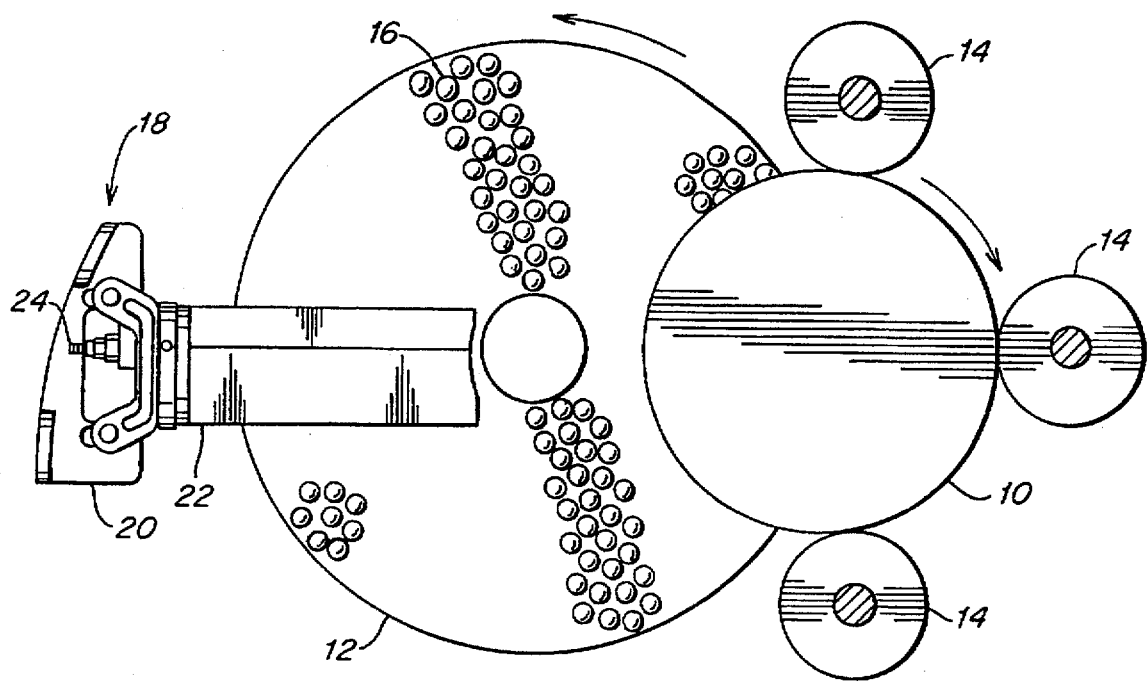
FIG. 1 is a schematic plan view of a cleaning tool showing the relative position of the wing of the invention to the semiconductor wafer and the rotating cleaning bushes.

While the invention is described in terms of a single preferred embodiment, those skilled in the art will recognize that variations in the specific details of the invention can be made within the spirit of the invention Referring to FIG. 1 there is shown an automated wafer cleaner of the prior art including a semiconductor wafer 10 located on a rotating cleaning pad or brush 12. The rotation of the brush causes the wafer 10 to rotate in the opposite direction. Three idler rollers 14 retain the wafer within the confines of the tool and allow the wafer to freely rotate.

In order to effectively clean wafers the brush 12 is made of a molded polyvinyl acetal elastic material containing air bubbles and having a plurality of nipple-like projections on its surface. Although the nipples facilitate cleaning of the semiconductor wafer surface they also tend to provide recesses for material removed from the surface of the wafers 10.

Shown opposite the wafer 10 is the wing assembly 18 of the invention. Assembly 18 comprises a support bracket 20 and a wing 22. Included as part of the wing element 22 is a nozzle 24 through which a cleaning fluid such as water may be passed under pressure.

As the brush 12 rotates the wing 22 is forced into contact with the surface of the brush exercising or flexing the surface providing agitation sufficient to loosen any particulate materials left from the previous wafer cleaned which may have adhered to the surface of the brush 12.

Figure 2:
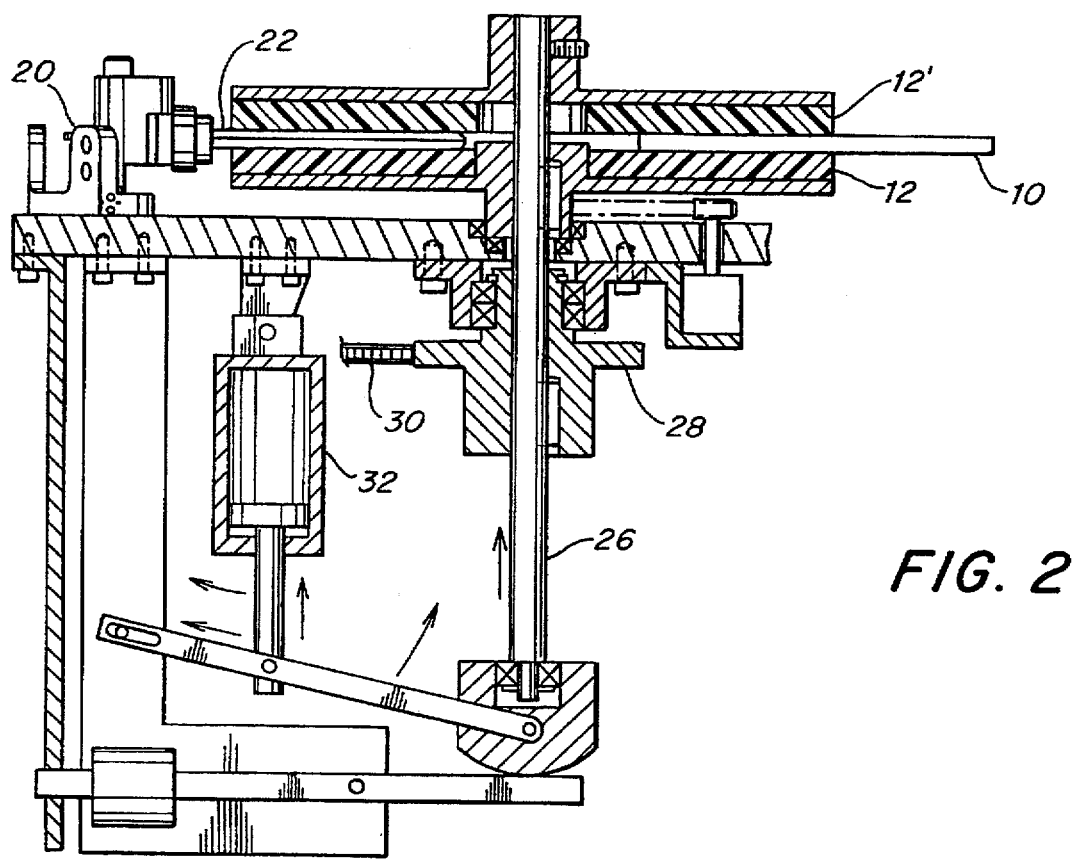
FIG. 2 is a sectional view showing the position of the wing of the invention mounted between the rotating brushes of the cleaning tool.

Referring briefly to FIG. 2 there is shown a cross section view of the cleaning tool illustrating a typical position of the conditioner wing with respect to the remainder of the tool. Within the tool there are provided two cleaning brush elements 12 and 12', one on either side of the wafer. Both brushes are fixed to a rotating shaft which in turn is coupled to a pulley 28 driven by belt 30. Control cylinder 32 is coupled to shaft 26 such that the upper cleaning brush 12' can be raised to allow the placement and removal of wafers to be cleaned between the idler rollers 14 (FIG. 1). As can be seen wing 22 is supported in a floating manner between the two brushes such that their surfaces are compressed and flexed as they pass over the wing's upper and lower surface.

Figure 3:
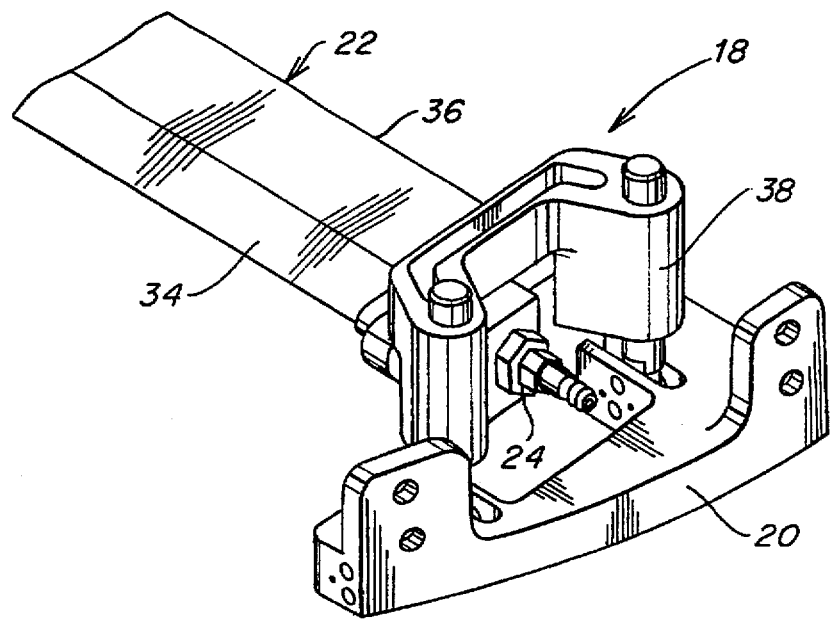
FIG. 3 is an isometric view of the wing assembly of the invention showing the optional nozzle for providing fluid to the wing while it is in use.

FIG. 3 is an isometric view of the conditioner wing assembly 18 and more clearly shows the nozzle mounted along the horizontal axis of the wing 22. As shown more clearly, the wing 22 has a leading edge 34 and a trailing edge 36. The top and bottom surfaces of the wing are tapered downward toward the leading and trailing edges to provide an intermediate region which actually contacts the brushes. Mounting bracket 20 includes a slider portion 38 mounted on a pair of generally vertical posts which allows the entire wing 22 to move or float freely up and down when it is between the brushes.

Figure 4:
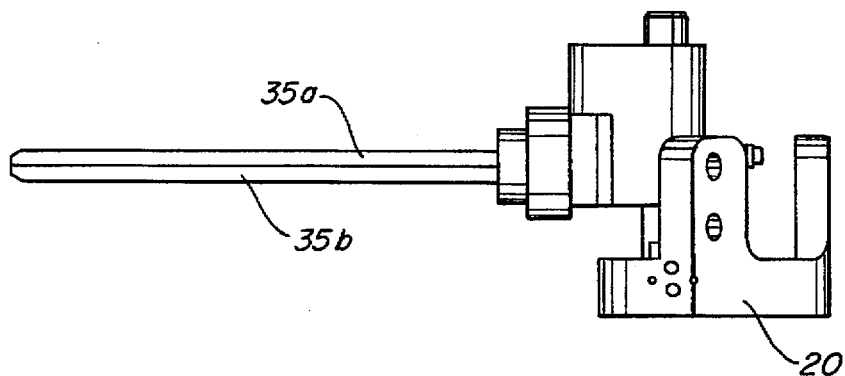
FIG. 4 is a front view of the wing assembly of the invention showing the relationship of the wing to the mounting bracket.

FIG. 4 is a frontal view of the wing assembly 22 showing the relationship of the various parts of the assembly. The upper leading surface 35a and lower leading surface 35b form an intermediate region of the wing.

Figure 5:
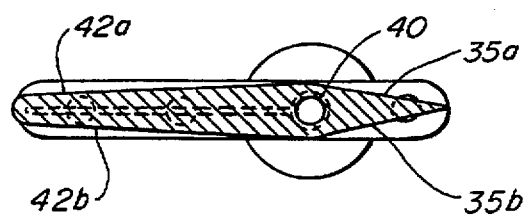
FIG. 5 is a sectional view of the wing of the invention showing the cross section of the wing and the ports for providing fluid to the wing and rotating brushes.

Referring now to FIG. 5 there is shown a cross section of the wing showing the opening along the longitudinal axis 40 through which a cleaning fluid may be passed and about which the wing is free to rotate as it "flies" between the rotating brushes. Also shown are the trailing upper surface 42a and the lower trailing surface 42b of the wing. The front edge of the leading edge is shaped to be a rather sharp edge in order to insure that the wing glides over the surface of the brushes rather than colliding and possibly tearing the molded polymer material from which the brushes 12 are made.

In operation, the conditioning and cleaning wing may be used either at the same time as wafers are being cleaned as shown, or can be used during a separate cleaning operation. This choice is primarily determined by the nature of the cleaning fluid chosen and whether it would be detrimental to the semiconductor wafers.

While the invention has been particularly shown and described with reference to a single preferred embodiment thereof, it will be understood by those skilled in the art the foregoing and other changes in form and details may be made without departing from the spirit and scope of the invention.

What is claimed is:

1. An apparatus for cleaning a porous and resilient cleaning element of a wafer cleaning tool comprising:
   a. a wing element having a first surface including a leading edge, a trailing edge and an intermediate region;
      1) the first surface of the wing element downwardly curved from the intermediate region toward both the leading edge and the trailing edge; and
      2) said wing element being capable of rotating about a central longitudinal axis passing through the intermediate region;
   b. means for bringing the intermediate region into contact with the cleaning element;
   c. means for imparting relative motion between said first surface of said wing element and said cleaning element; and
   d. means for flushing the cleaning element with a fluid.

2. The apparatus of claim 1, wherein said wing element has two opposed first surfaces, the second of said first surfaces being in contact with a second cleaning element.

3. The apparatus of claim 1, wherein said first surface causes flexing of the cleaning element.

4. The apparatus of claim 1, wherein the portion of said first surface between said central longitudinal axis and said trailing edge is greater than the distance between said axis and said leading edge.

5. The apparatus of claim 2, wherein said wing element is mounted in said apparatus to permit unrestricted movement in a direction perpendicular to the surface of the cleaning element.

6. The apparatus of claim 2, wherein said wing element is mounted in said apparatus to permit said wing to rotate about said longitudinal axis.

7. The apparatus of claim 1, wherein said means for flushing the cleaning element is contained inside of said wing.

\* \* \* \* \*